United States Patent [19]

Chambers

[11] Patent Number: 5,315,267
[45] Date of Patent: May 24, 1994

[54] COMPOSITE DIFFERENTIAL DIRECT-COUPLED INSTRUMENTATION AMPLIFIER

[75] Inventor: William R. Chambers, Walnut, Calif.

[73] Assignee: Neff Instrument Corporation, Monrovia, Calif.

[21] Appl. No.: 817,863

[22] Filed: Jan. 6, 1992

[51] Int. Cl.$^5$ ............................................. H03F 3/68
[52] U.S. Cl. .................................. 330/275; 330/252; 330/84; 330/124 R
[58] Field of Search ................... 330/252, 295, 69, 84, 330/124 R, 261, 126, 151, 311

[56] References Cited

U.S. PATENT DOCUMENTS

| | | | |
|---|---|---|---|
| 3,757,241 | 9/1973 | Kime et al. | 330/9 |
| 4,242,741 | 12/1980 | Parrish | 330/84 |
| 4,595,884 | 7/1986 | Miller, Jr. | 330/258 |
| 4,599,574 | 7/1986 | Chambers | 330/311 |
| 4,694,110 | 10/1990 | Horimai et al. | 369/13 |
| 5,075,633 | 12/1991 | Bowers | 330/69 |
| 5,103,122 | 4/1992 | O'Leary et al. | 330/9 |
| 5,150,071 | 9/1992 | Bouzidi | 330/295 |
| 5,159,286 | 10/1992 | Ito | 330/260 |

OTHER PUBLICATIONS

Circuit Ideas (Electronic & Wireless World), Feb. 1986, p. 33.

*Primary Examiner*—Robert J. Pascal
*Assistant Examiner*—Tan Dinh
*Attorney, Agent, or Firm*—Robert Fraser

[57] ABSTRACT

A differential amplifier which utilizes a pair of wideband operational amplifiers as output stages for two differential output signals, a pair of high performance DC operational amplifiers to buffer input signals to the pair of wideband operational amplifiers used as output stages and reduce offset voltage error by the amount of the DC gain of the pair of high performance DC operational amplifiers, apparatus for biasing the pair of high performance DC operational amplifiers to provide exceptional DC characteristics and eliminate common mode response from those amplifiers, and apparatus for feeding forward high frequency AC input to the wideband operational amplifiers operating as the output stages without loading the common mode input impedance of the differential amplifier.

11 Claims, 3 Drawing Sheets

COMPOSITE DIFFERENTIAL DIRECT-COUPLED INSTRUMENTATION AMPLIFIER

BACKGROUND OF THE INVENTION

1. Field Of The Invention

This invention relates to differential amplifiers and, more particularly, to circuitry utilizing DC operational amplifiers to form a composite differential direct-coupled instrumentation amplifier having both high DC accuracy and wide bandwidth.

2. History Of The Prior Art

A typical prior art instrumentation amplifier is implemented with three operational amplifiers. Two of the operational amplifiers each receive one of the two differential input signals the difference between which is to be measured; these two operational amplifiers each provide high closed loop gains. The two output signals generated by these operational amplifiers are furnished as the input signals to the third operational amplifier which utilizes balanced feedback and input resistors so that it operates at a closed loop gain of one. Because it operates at a gain of one, it may provide a relatively high bandwidth of approximately one megahertz and little DC error.

Several types of operational amplifiers may be used in such a circuit with varying performance characteristics. However, devices which provide good DC performance do not provide closed loop bandwidths above a few kilohertz. Because of their limited bandwidth, they also exhibit poor AC characteristics and have poor AC common mode rejection at frequencies as low as 60 hertz. Conversely, operational amplifiers which can provide closed-loop bandwidths approaching one megahertz have DC errors several orders of magnitude higher than the precision DC devices.

A high performance instrumentation amplifier, intended for multi-frequency use, should provide both good DC performance as well as frequency response and well controlled phase shift characteristics from DC to beyond 500 kilohertz. By comparing these statistics with those of a typical prior art instrumentation amplifier, it may be seen that the typical instrumentation amplifier does not provide these results.

SUMMARY OF THE INVENTION

It is, therefore, an object of the present invention to provide improved instrumentation amplifiers.

It is another more specific object of the present invention to provide an instrumentation amplifier with a frequency response from DC to over 500 kilohertz exhibiting minimal DC offset, little bias current, high common mode rejection, and high closed loop gain.

These and other objects of the present invention are realized in a differential amplifier which utilizes a pair of wideband operational amplifiers as the output stages for the two differential output signals, a pair of high performance DC operational amplifiers to buffer the input signals to the output operational amplifiers and reduce the offset voltage error by the amount of their DC gain, means for biasing the pair of high performance DC operational amplifiers to provide exceptional DC characteristics and eliminate common mode response from those amplifiers, and means for feeding forward high frequency AC input to the wideband operational amplifiers operating as the output stages.

These and other objects and features of the invention will be better understood by reference to the detailed description which follows taken together with the drawings in which like elements are referred to by like designations throughout the several views.

DETAILED DESCRIPTION OF THE INVENTION

Figure 1:
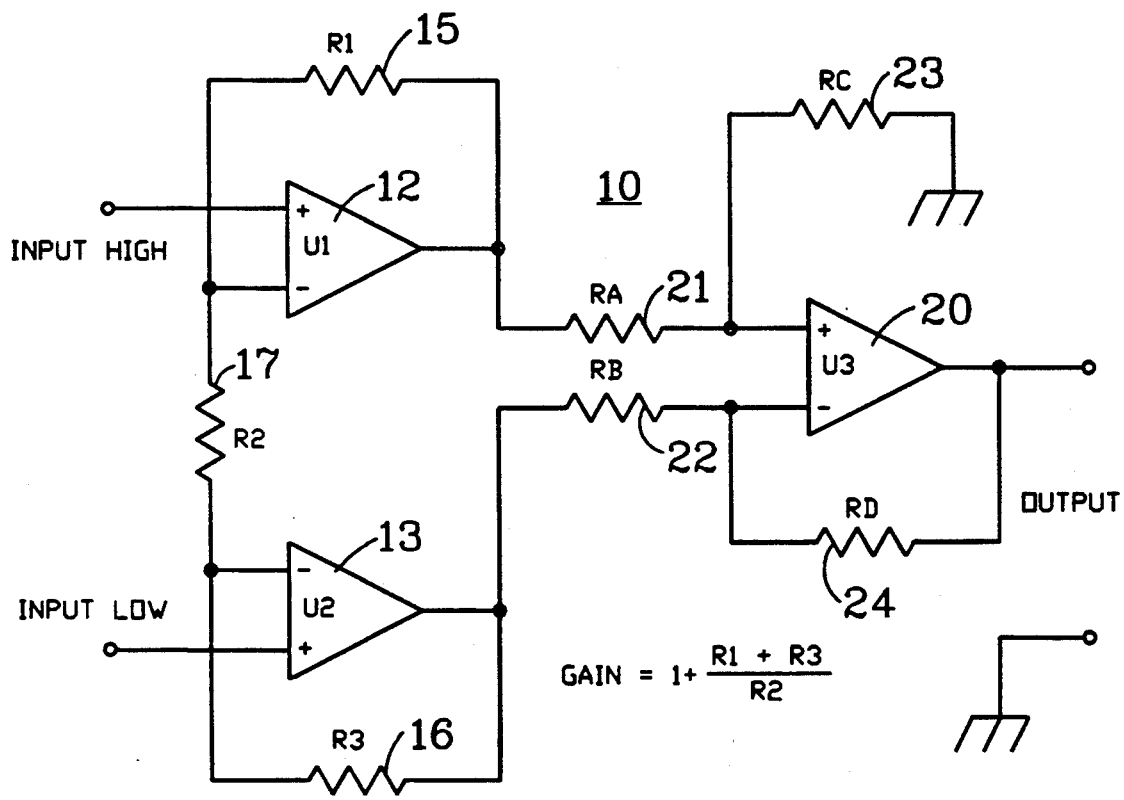
FIG. 1 is a circuit diagram illustrating a prior art instrumentation amplifier.

Referring now to FIG. 1, there is illustrated a circuit diagram of an instrumentation amplifier 10 designed in accordance with the prior art. The instrumentation amplifier 10 includes first and second matched operational amplifiers 12 and 13. The operational amplifier 12 receives the high end of the differential input at its non-inverting input terminal, and the operational amplifier 13 receives the low end of the differential input at its non-inverting input terminal. The operational amplifier 12 receives feedback at its inverting input terminal from its output terminal via a resistor 15 while the operational amplifier 13 receives feedback at its inverting input terminal from its output terminal via a resistor 16. A resistor 17 joins the inverting terminals of the two operational amplifiers 12 and 13.

The output of the operational amplifier 12 is furnished to the non-inverting input terminal of a third operational amplifier 20 by a resistor 21. The output of the operational amplifier 13 is furnished to the inverting input terminal of the third operational amplifier 20 by a resistor 22. A resistor 23 connects the non-inverting input terminal of the operational amplifier 20 to ground, and a resistor 24 connects the inverting input terminal of the operational amplifier 20 to its output to provide feedback. The output signal is taken between the output terminal of the operational amplifier 20 and ground.

Typically, the resistors 21, 22, 23, and 24 are all carefully selected to have equal values so that the stage including the operational amplifier 20 has a gain of one. This allows the last stage to have characteristics which provide good operation at higher frequencies and to accept a relatively wide bandwidth. The balanced resistors 21-24 provide significant common mode rejection properties. Even though the amplifier 20 is not designed to have good DC characteristics, the DC error is kept to a minimum because the amplifier 20 provides a gain of only one.

All of the gain of the instrumentation amplifier 10 is provided by the first stage which includes the two high precision operational amplifiers 12 and 13. The gain for the circuit 10 is equal to $1+((R1+R3)/R2)$, where $RA=RB=RC=RD$. The first stage typically provides gain for the circuit 10 of from one to one thousand, and amplifies input signals from a few millivolts to ten volts. As pointed out above, the input amplifiers 12 and 13 are typically matched operational amplifiers having very good DC characteristics. Thus, the DC input signals handled by the circuit 10 are provided to the operational amplifier 20 with little error.

A number of operational amplifiers are available as off-the-shelf items which may be used in the circuit 10. Many of these operational amplifiers provide good DC characteristics such as offset voltages of under ten microvolts with temperature coefficients of less than 0.25 uV/degree centigrade, and input bias currents of less than 0.25 nanoamperes over wide temperature ranges with very low noise. However, operational amplifiers which provide good DC performance do not provide closed loop bandwidth much above a few kilohertz.

The output of the amplifiers 12 and 13 are provided to the amplifier 20. Although an operational amplifier such as amplifier 20 can provide closed-loop bandwidths approaching one megahertz, such amplifiers have DC errors several orders of magnitude higher than the precision DC devices. However, the errors produced at the DC end of the frequency spectrum are not magnified by the amplifier 20 because of its low gain. The amplifier 20 provides fairly decent common mode rejection as well because of its balanced resistor network. However, the input amplifiers 12 and 13 are not able to handle higher frequencies accurately, so the input signals at higher frequencies provided to the amplifier 20 contain high frequency distortion. Because of this, the circuit 10 cannot produce the desired specifications which have been outlined above. In fact, such a circuit cannot be expected to provide a closed loop bandwidth much above a few kilohertz.

Figure 2:
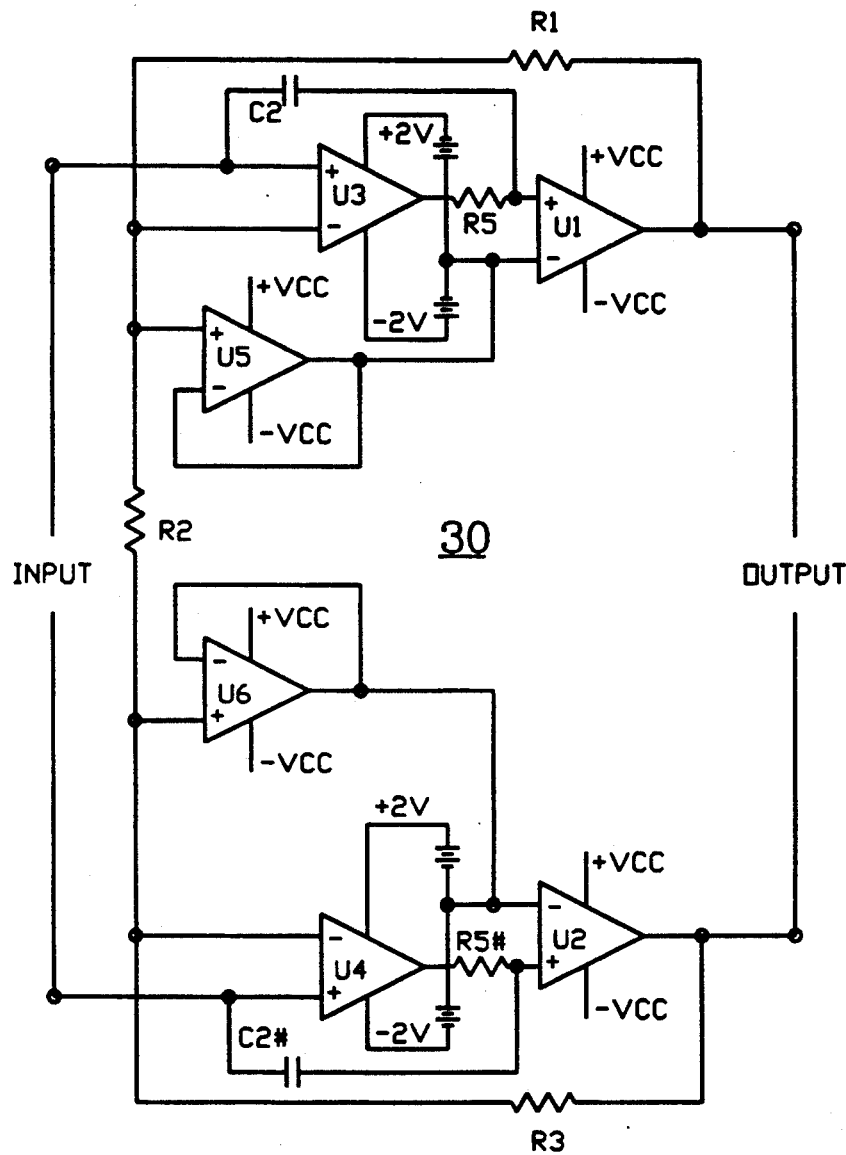
FIG. 2 is a circuit diagram of an instrumentation amplifier in accordance with the present invention.

To provide both wide bandwidth and excellent DC characteristics, a circuit 30 of FIG. 2 has been devised in accordance with the present invention. The circuit 30 includes a pair of matched output operational amplifiers U1 and U2. Each of the output amplifiers is chosen and biased to provide wide band operation. To this end, biasing is provided by sources Vcc and −Vcc which are typically 15 volts.

A pair of matched high precision operational amplifiers U3 and U4 receive the differential input signals at their non-inverting input terminals, amplify those signals, and provide input signals to the non-inverting input terminals of the amplifiers U1 and U2, respectively. The amplifiers U3 and U4 are chosen to provide excellent DC performance and high gain. The output of the amplifiers U1 and U2 are fed back to the inverting input terminal of the amplifiers U3 and U4. Since the high gain amplifiers U3 and U4 tend to produce an output to bring their inverting input terminals to the same voltage as the non-inverting input terminals, the offset voltage error of the amplifiers U1 and U2 is reduced by the amount of the DC gain of the amplifiers U3 and U4.

In order to assure the precision DC characteristics of the amplifiers U3 and U4, floating power supplies of plus and minus two volts are provided in the preferred embodiment of the circuit 30. The amplifiers U3 and U4 are biased from very small floating voltage sources such as the two (two volt) batteries illustrated in the figure. Because the amplifiers U3 and U4 are biased from floating potential sources rather than Vcc and minus Vcc, these amplifiers operate independently of the input signal level and are not subjected to common mode input voltages. The common mode input voltages are passed through to the amplifiers U1 and U2.

Feedback from the operational amplifier U1 is buffered by an additional operational amplifier U5. Feedback from the operational amplifier U2 is buffered by an additional operational amplifier U6. Each of the amplifiers U5 and U6 are connected as voltage followers with gain = +1. Since the non-inverting input terminals of the amplifiers U5 and U6 are connected to receive the feedback from the output terminal of U1 and U2 as are the inverting input terminals of the amplifiers U3 and U4, respectively, the voltage at the non-inverting input to the amplifiers U5 and U6 moves with the voltage at the inverting terminals of the amplifiers U3 and U4 to seek the same level as the non-inverting terminals of the amplifiers U3 and U4. Since the non-inverting input to the amplifiers U5 and U6 moves with the non-inverting input of the amplifiers U3 and U4 and because the amplifiers U5 and U6 have a gain of one, the output terminals of the amplifiers U5 and U6 move with the voltage at the non-inverting input terminals of the amplifiers U3 and U4. The output terminals of these amplifiers U5 and U6 are connected between the two batteries which are the floating power supplies for the amplifiers U3 and U4. Consequently, the voltage level between the fixed two volt power supplies moves (as do the output terminals of the amplifiers U5 and U6) with the input to the amplifiers U3 and U4; and the amplifiers U3 and U4 do not see the common mode voltage movements with respect to the sources Vcc and −Vcc. Thus, the precision DC amplifiers U3 and U4 are not subject to common mode voltages.

Since the amplifiers U3 and U4 are not subject to the common mode input voltages which are passed on to the amplifiers U1 and U2, the maximum common mode swing is limited by the voltage swing capabilities of the amplifiers U1, U2, U5, and U6, all of which are biased by the values of Vcc and minus Vcc (typically 15 v. and −15 v.).

Input signals to the circuit 30 are provided at the non-inverting input terminals of the amplifiers U3 and U4. Because the amplifiers U3 and U4 are chosen to have excellent DC characteristics, input signals at the DC end of the frequency spectrum are handled accurately and transferred in their amplified condition to the wide band amplifiers U1 and U2 so that the composite amplifier 30 may be made to respond very well to low frequency input signals.

However, higher frequencies are subject to distortion by the amplifiers U3 and U4 which are tuned to handle DC levels with precision; and amplification of these higher frequencies is attenuated by approximately six decibels per octave beginning at a frequency which varies with the characteristics of the amplifiers U3 and U4 but may be about 0.1 hertz. In order to provide the desired wide band characteristics, a pair of capacitors C2 and C2# provide the high frequency input signals furnished at the differential input terminals to the circuit 30 to the amplifiers U1 and U2. The capacitors C2 and C2# have values selected and are arranged to transfer the higher frequency input signals around the amplifiers U3 and U4 to the non-inverting input terminals of the amplifiers U1 and U2. In this manner, the higher frequency values are transferred to the stages U1 and U2 which are capable of transferring those signals with low distortion. In order to assure that the high frequency input signals which bypass the amplifiers U3 and U4 are not loaded, resistors R5 and R5# are provided. Since the output of the amplifier U5 is not only arranged to bias the center of the floating (two volt) power supplies but is also connected to the inverting input to the amplifier U1, the voltage at the inverting input to the amplifier U1 moves with input to the non-inverting terminal to the amplifier U3. Since voltage at the inverting terminal of amplifier U1 tends to follow the non-inverting terminal, this places the same voltage on both sides of the capacitor C2 to assure that the amplifier U1 is not loaded by the capacitor C2. The amplifier U6 operates similarly with respect to the capacitor C2#. Consequently, the common mode input impedance of the overall differential amplifier is not loaded by the bypass arrangement.

Although the output of the circuit 30 illustrated is a differential output, a final stage such as that illustrated in FIG. 1 including the amplifier 20 could be added at the output terminals and utilized to provide a single ended output referred to ground.

Figure 3:
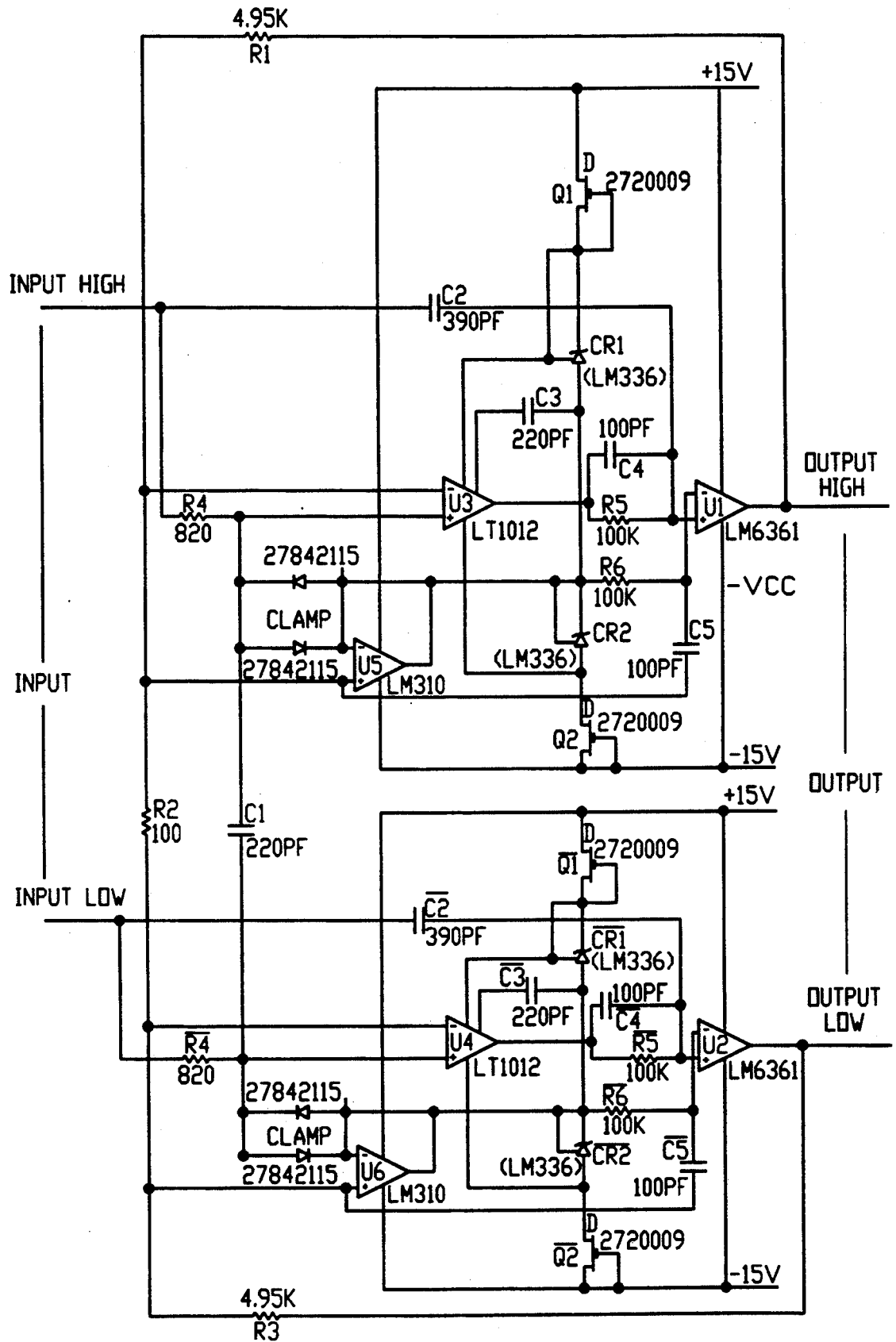
FIG. 3 is another circuit diagram of an instrumentation amplifier in accordance with the present invention.

FIG. 3 illustrates another circuit 40 constructed in accordance with the present invention. The circuit 40 is very similar to the circuit 30 illustrated in FIG. 2 but is the presently preferred embodiment of the invention; for this reason, values of circuit elements necessary for an operating circuit are provided in the figure. The circuit 40 includes a pair of output operational amplifiers U1 and U2. Each of the output amplifiers is chosen to provide wide band operation. To this end, National Semiconductor operational amplifiers LM6361 (manufactured by National Semiconductor Co., 2900 Semiconductor Drive, Santa Clara, CA. 95052) or similar devices may be used.

A pair of high precision operational amplifiers U3 and U4 which are matched for offset voltage provide input signals to the non-inverting input terminals of the amplifiers U1 and U2, respectively. The amplifiers U3 and U4 are chosen to provide excellent DC performance and high gain. The amplifiers U3 and U4 essentially buffer the input signals provided to amplifiers U1 and U2 and reduce the DC offset voltage error of the amplifiers U1 and U2 by the amount of their DC gain. In order to provide these characteristics, a pair of Linear Technology operational amplifiers LT1012 (manufactured by Linear Technology Co., 1630 McCarthy Blvd., Milpitas, CA. 95035) or similar devices may be used.

In order to assure the precision DC characteristics of the amplifiers U3 and U4, floating power supplies providing plus and minus two volts are provided in the preferred embodiment of the circuit 40. These power supplies are furnished by a pair of field effect transistors Q1 and Q2 which are connected, respectively, to Vcc and −Vcc values of 15 volts. The field effect transistors Q1 and Q2 have their gate terminals joining their source terminals so that they are biased into the saturation condition (IDss) and each acts as a constant current source. A pair of zener diodes CR1 and CR2 join the source terminal of transistor Q1 to the drain terminal of the transistor Q2 to provide a constant floating plus and minus two volts to supply operating power to the amplifiers U3 and U4. Because the amplifiers U3 and U4 are biased from floating potential sources rather than Vcc and minus Vcc, these amplifiers operate independent of input signal level and any common mode input voltages. The common mode input voltages are passed through to the amplifiers U1 and U2.

Feedback from the operational amplifier U1 is buffered by an additional operational amplifier U5. Feedback from the operational amplifier U2 is buffered by an additional operational amplifier U6. Each of the amplifiers U5 and U6 are connected as gain +1 voltage followers. The output terminals of these amplifiers U5 and U6 are connected between the zener diodes CR1 and CR2 and thus drive the value of the source voltages applied to the amplifiers U3 and U4 to maintain a floating power supply level for those amplifiers U3 and U4. To this end, National Semiconductor operational amplifiers LM310 (manufactured by National Semiconductor Co., 2900 Semiconductor Drive, Santa Clara, CA. 95052) or similar devices may be used for the amplifiers U5 and U6.

Since the amplifiers U3 and U4 are not subject to the common mode input voltages which are passed on to the amplifiers U1 and U2, the maximum common mode swing is limited by the voltage swing capabilities of the amplifiers U1, U2, U5, and U6, all of which are biased by the values of Vcc and minus Vcc (typically 15 v. and −15 v.).

Because the amplifiers U3 and U4 are chosen to have excellent DC characteristics and the amplifiers U1 and U2 are wide band devices, the composite amplifier may be made to respond very well to low frequency input signals. Moreover, capacitors C2 and C2# are arranged to transfer the higher frequency input signals around the amplifiers U3 and U4 to the non-inverting input terminals of the amplifiers U1 and U2. In this manner, the higher frequency values are transferred to the stages U1 and U2 which are capable of transferring those signal with low distortion. In order to assure that the high frequency input signals which bypass the amplifiers U3 and U4 are not loaded, a parallel arrangement including a capacitor C4 and a resistor R5 is provided. The capacitor C4 and the resistor R5 are chosen to provide a tuned RC network with the internal values of the two amplifiers U1 and U3 so that a stable feedback loop is obtained for the circuit 40. The values used for the resistor R5 and the capacitor C4 will, of course, depend on the particular amplifiers U1 and U3 used in the circuit 40.

The values of circuit elements not otherwise discussed in this specification are given in FIG. 3. A circuit 40 such as that illustrated in FIG. 3 provides the following characteristics:

Closed loop gain x100
Full scale output +/−10 volts
Common mode range +/−10 volts
Frequency response DC to 750 kilohertz
Slew rate 40 volts/uSec.
DC offset +/−10 uV RTI
DC offset vs. temp. +/−0.25 uV/degree C RTI
Bias current +/−0.25 nA.
Bias current vs. temp. +/−0.05 nA/degree C.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A differential instrumentation amplifier comprising a pair of wideband operational amplifiers as output stages for two differential output signals, a pair of high performance DC operational amplifiers to buffer input signals to the output operational amplifiers and reduce offset voltage error by the amount of their DC gain, means for biasing the pair of high performance DC operational amplifiers to provide precision DC characteristics and eliminate common mode responses from the high performance DC operational amplifiers, and means for feeding forward high frequency AC input to the wideband operational amplifiers operating as output stages while eliminating common mode voltages in the high frequencies, in which the means for biasing the pair of high performance DC operational amplifiers to provide precision DC characteristics and eliminate common mode response from the high performance DC operational amplifiers comprises first and second floating voltage sources for applying voltage levels to each of the high performance DC operational amplifiers, means joining one terminal of each of the first and second floating voltage sources associated with each high performance DC operational amplifier to a biasing terminal of the high performance DC operational amplifier, and means for varying the voltage level at a second terminal of the first and second floating voltage sources to match a level at a non-inverting input to the associated amplifier.

2. A differential instrumentation amplifier as claimed in claim 1 in which the first and second floating voltage sources provide voltage at a lower level than biasing levels provided for the pair of wideband operational amplifiers.

3. A differential instrumentation amplifier as claimed in claim 1 in which the first and second floating voltage sources each comprise a zener diode, and a source of constant current for the zener diode.

4. A differential instrumentation amplifier as claimed in claim 1 in which the means for varying the voltage level of the second terminal of each of the first and second floating voltage sources to match a level at a non-inverting input to the associated amplifier comprises a unity gain operational amplifier having an output terminal connected to the second terminal of each of the first and second floating voltage sources, and means for providing a voltage level at a non-inverting input to the associated high performance DC operational amplifier to a non-inverting input terminal of the operational amplifier having unity gain.

5. A differential instrumentation amplifier comprising a pair of wideband operational amplifiers as output stages for two differential output signals, a pair of high performance DC operational amplifiers to buffer input signals to the output operational amplifiers and reduce offset voltage error by the amount of their DC gain, means for biasing the pair of high performance DC operational amplifiers to provide precision DC characteristics and eliminate common mode responses from the high performance DC operational amplifiers, and means for feeding forward high frequency AC input to the wideband operational amplifiers operating as output stages while eliminating common mode voltages in the high frequencies, in which the means for feeding forward high frequency AC input to the wideband operational amplifiers operating as output stages comprises a capacitor joining a non-inverting input terminal of each of the high performance DC operational amplifiers with a non-inverting input terminal of each of the output operational amplifiers.

6. A differential instrumentation amplifier as claimed in claim 5 in which the means for biasing the pair of high performance DC operational amplifiers to provide precision DC characteristics and eliminate common mode response from the high performance DC operational amplifiers comprises first and second floating voltage sources for applying voltage levels to each of the high performance DC operational amplifiers, means joining one terminal of each of the first and second floating voltage sources associated with each high performance DC operational amplifier to a biasing terminal of the high performance DC operational amplifier, and means for varying the voltage level at a second terminal of the first and second floating voltage sources to match a level at a non-inverting input to the associated amplifier.

7. A differential instrumentation amplifier as claimed in claim 6 in which the first and second floating voltage sources comprise a pair of batteries.

8. A differential instrumentation amplifier as claimed in claim 6 in which the first and second floating voltage sources each comprise a zener diode, and a source of constant current for the zener diode.

9. A differential instrumentation amplifier as claimed in claim 6 in which the means for varying the voltage level of the second terminal of each of the first and second floating voltage sources to match a level at a non-inverting input to the associated amplifier comprises a unity gain operational amplifier having an output terminal connected to the second terminal of each of the first and second floating voltage sources, and means for providing a voltage level at a non-inverting input to the associated high performance DC operational amplifier to a non-inverting input terminal of the operational amplifier having unity gain.

10. A differential instrumentation amplifier comprising a pair of wideband operational amplifiers as output stages for two differential output signals, a pair of high performance DC operational amplifiers to buffer input signals to the wideband output operational amplifiers and reduce offset voltage error by the amount of the DC gain of the wideband amplifiers, and means for biasing the pair of high performance DC operational amplifiers to provide precision DC characteristics and eliminate common mode responses from the high performance DC operational amplifiers, the means for biasing including first and second floating voltage sources for biasing each of the high performance DC operational amplifiers, means joining one terminal of each of the first and second floating voltage sources associated with each high performance DC operational amplifier to a biasing terminal of the high performance DC operational amplifier, and means for varying the voltage level at a second terminal of the first and second floating voltage sources to follow an input signal level at an input to the associated high performance DC operational amplifier.

11. A differential instrumentation amplifier as claimed in claim 10 in which the means for varying the voltage level at a second terminal of the first and second floating voltage sources to follow an input signal level at an input to the associated high performance DC operational amplifier comprises:
 feedback means coupling the output of the each wideband operational amplifier to the second terminal of the first and second voltage sources of the high performance DC operational amplifier joined to a non-inverting input of that wideband operational amplifier, and
 in which the feedback means is connected to an inverting input of the high performance DC operational amplifier which is joined to the non-inverting input of that wideband operational amplifier.

* * * * *